Dec. 24, 1963 H. W. MEISSNER 3,115,612

SUPERCONDUCTING FILMS

Filed Aug. 14, 1959 2 Sheets-Sheet 1

HANS W. MEISSNER
INVENTOR.

BY Walter G. Finch
ATTORNEY

HANS W. MEISSNER
INVENTOR.

BY Walter G. Finch
ATTORNEY

United States Patent Office 3,115,612

Patented Dec. 24, 1963

3,115,612

SUPERCONDUCTING FILMS

Hans W. Meissner, 1010 Marlau Drive, Baltimore, Md., assignor of one-half to Walter G. Finch, Baltimore, Md.

Filed Aug. 14, 1959, Ser. No. 833,815
14 Claims. (Cl. 338—32)

This invention relates generally to electrical circuit elements, and more particularly the invention pertains to superconducting films for use in superconducting circuit elements.

The art of superconductivity is concerned with the principle of zero resistivity exhibited by certain metals and alloys at a temperature near to that of liquid helium. Various circuits and networks have been devised to make use of this property.

In computers as well as data processing equipment superconducting elements have been used for switching devices, memory devices and amplifiers.

In the construction of such devices one was limited so far by the use of pure metals for the manufacture of wires and films used in the devices, which did not allow for a significant change of the superconducting properties controlling the electromagnetic sensitivity of these devices. Also another disadvantage of prior devices is their low corrosion resistance which may shorten the lifetime.

The principal object of this invention is to provide thin superconducting films or wires in which a large variation of the superconducting properties thereof are obtained through the utilization of combinations of films of different metals or core-and-sheath wires also made of different metals. In other words this invention provides superconducting films or wires with a much larger variation of their electromagnetic sensitivity than formerly possible.

Another object of this invention is to provide, by suitable choice of the sequence of the layers of metals, superconducting films with improved corrosion resistance.

These and other objects and advantages of this invention will become more fully understood from the following specification and accompanying drawings in which.

The principle of operation of memory and similar devices as mentioned heretofore is demonstrated in FIG. 1 and is described in the following publications:

(1) D. A. Buck, "The Cryotron—a Superconductive Computer Component," Proceedings of the IRE, vol. 44, p. 482 (1956); and (2) J. W. Crowe, "Trapped Flux Superconducting Memory," Low Temperature Physics and Chemistry (edited by J. R. Dillinger), University of Wisconsin Press, Madison, 1958.

Figure 1:
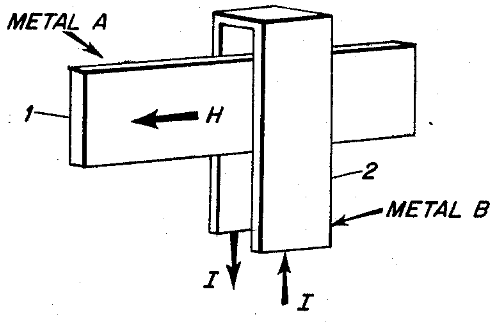
FIG. 1 is a perspective view of a typical device used for switching as well as amplifying with superconducting circuit elements.

Referring to FIG. 1, a circuit element 1 of metal A, is shown which at the temperature of operation and zero magnetic field is superconducting. Circuit element 1 is exposed to a magnetic field H, which is created by a current I through a circuit element 2 of metal B, which element 2 at the temperature T of operation and the currents I used remains superconducting. If the magnetic field H of the current I through the element 2 exceeds a certain value, called the critical field $H_C$, it destroys superconductivity either partially or completely in element 1.

The proper operation of such devices requires that the transition temperature $T_{CA}$ of metal A for element 1, that is, the temperature at which metal A of element 1 becomes superconducting in zero magnetic field H, is only slightly higher than the operating temperature T. The transition temperature $T_{CB}$ of metal B of element 2 however, must be much higher than the operating temperature. Presently circuit elements involving the principles outlined above have been constructed using pure metals such as indium, tin, tantalum and vanadium for metal A, and pure metals, such as lead and niobium for metal B.

Figure 2:
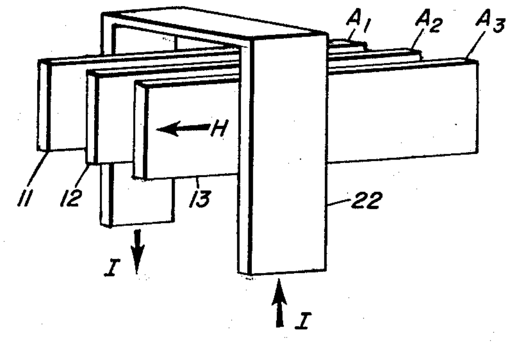
FIG. 2 is a perspective view of a device similar to FIG. 1, but capable of differentiating between various values of the exciting current.

In certain cases, it is desirable to have not only one circuit element 1 of metal A, as in FIG. 1, but a series of elements 11, 12, 13 . . . of metals $A_1$, $A_2$, $A_3$, with closely spaced transition temperatures $T_{CA_1}$, $T_{CA_2}$, $T_{CA_3}$ . . . as shown in FIG. 2. These elements then are able to differentiate between various values $H_1$, $H_2$, $H_3$ . . . of the magnetic field H produced by appropriate values $I_1$, $I_2$, $I_3$ . . . of the current I through the circuit element 22 of metal B, where element 22 corresponds to circuit element 2 of FIG. 1.

Up to the present time the spacing of the transition temperature $T_C$ of available pure metals is very coarse, so that a differentiating operation is not possible.

At the present time there is only one way known by which the sensitivity of the circuit elements 11, 12, 13 . . . to the magnetic field H can be adjusted. If the circuit element 1 of FIG. 1 or circuit elements 11, 12, or 13 of FIG. 2 are made in the shape of of very thin films, it is possible to decrease their sensitivity by decreasing their thickness. Any significant variation, however, requires very small thicknesses of film of about 200 A.U. as set forth by M. V. Lane in "Theory of Superconductivity," Academic Press, Inc., New York, 1952, p. 133 seq., which result in great sensitivity against oxidation and corrosion. A change in thickness of film usually leaves the transition temperature of the film unchanged. Accordingly, the films of this invention make it possible to obtain a large variation of the superconducting properties of thin films through the utilization of combinations of films or wires of different metals for use in superconducting circuit elements.

In order that the terminology used in this specification will be clearly understood, certain terms are defined below.

A "superconducting circuit element" is defined as a sensing element of a electrical device, which sensing element at least during a part of its operation is at least partially superconducting and in which use of the superconducting properties of the sensing element is made for switching, counting, adding, subtracting or any of the other operations commonly used in computing or data processing equipment.

A "superconducting film" is defined as a metallic film which in the absence of a current as well as a magnetic field at the temperature of the operation of the device is at least partially superconducting.

A "normal conducting film" is defined as a metallic film which in the absence of a current as well as a magnetic field at the temperature of operation is normal conducting. It shall be considered normal conducting even if it should go into the superconducting state at a temperature lower than the temperature of operation.

"Partially superconducting" is defined as the state of a metallic device which at the temperature of operation shows a decrease of the electrical resistance below the value in its normal state, and is able to be brought into said normal state by application of a sufficiently large magnetic field.

"Superconducting properties" include among others which may exist but are not named the transition temperature $T_C$ at which the device becomes resistanceless in the absence of currents as well as magnetic fields; the critical current $I_C$, which if passed through the device at a temperature T smaller than $T_C$ restores about half of the normal resistance; and the critical field $H_C$, which if imposed on the device at a temperature T smaller than $T_C$ restores about half of the normal resistance.

Critical current and critical fields of thin film depend on the density of the superconducting electrons. The term "density of superconducting electrons" shall be used here in the sense of a two-fluid model, that is, of a model of a fluid of superconducting electrons intermixed with a fluid of normal conducting electrons. Such a model has certain limitations, but it shall be used here to facilitate the following discussion.

The term "properties of a metal" shall include among others which may exist but are not named the total density of electrons; the density of states at the Fermi surface; and the phonon spectrum of the ionic lattice.

Figure 3:
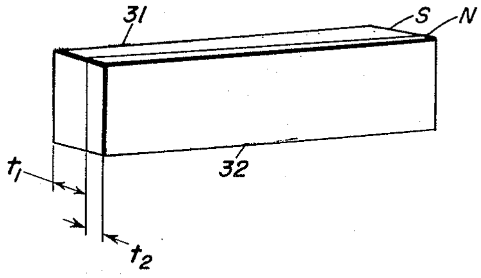
FIG. 3 is a perspective view of two thin films of dissimilar metals positioned in intimate contact.
Figure 4:
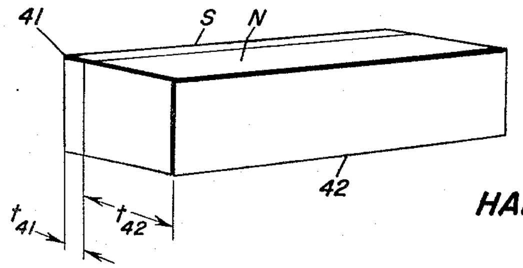
FIG. 4 is a perspective view of a thin film and a slab of dissimilar metals positioned in intimate contact.
Figure 5:
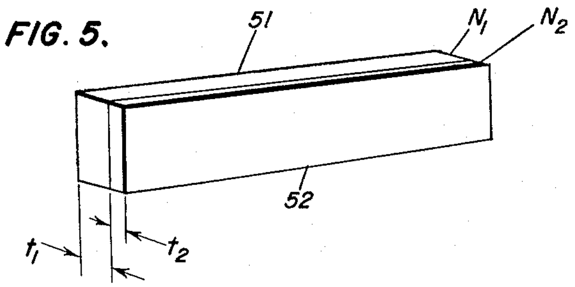
FIG. 5 is a perspective view of two thin films of dissimilar metals positioned in intimate contact.

Referring now to FIGS. 3 to 5, the principle of the invention can best be demonstrated. In FIG. 3, there is shown a film 31 of thickness $t_1$ made of a metal S, which may be lead or tin which in bulk form is superconducting at the temperature of operation of the device. This film 31 is placed in intimate contact with a film 32 of thickness $t_2$ made of a metal N, which may be copper, silver, gold, or constantan, which metal in bulk form is normal conducting at the temperature of operation of the device. Depending on the metals S and N and thicknesses $t_1$ and $t_2$ used, various effects can be produced as discussed below.

If the thicknesses of films 31 and 32 differ not more than an order of magnitude and are of the order of a few thousand A. (angstrom units), the density of the superconducting electrons in the combination of the two films 31 and 32 will be different from the value which the density would have if the two films were separated, since superconducting electrons will drift from the superconducting film 31 into the normal conducting film 32 and normal electrons will drift in the opposite way to maintain the net charge everywhere at zero.

In the steady state of these drifting electron fluids, the density of the superconducting electrons in film 31 will be lower than the corresponding density in a corresponding film 31 not in intimate contact with the film 32. On the other hand, the density of superconducting electrons in the normal conducting film 32 is not zero, as it would be if the film 32 were not in intimate contact with a superconducting film 31, but the density has a finite value which gradually decreases from the side of film 32 facing film 31 to the opposite side.

The combination of the two films 31 and 32 acts, therefore, as one film with a density of the superconducting electrons being smaller than that of the film 31 alone, with an effective thickness $t_{eff}$ in between $t_1$ of a few thousands A.U. or less and $t_1+t_2$ typical between 100 and 10,000 A.U.: $t_1<t_{eff}<t_1+t_2$. Since some of the superconducting properties are connected with the density of superconducting electrons, it is thus possible to vary some of the superconducting properties of the films 31 and 32 over a large range by suitable choice of metals, N and S, and thicknesses $t_1$ and $t_2$ of the films 31 and 32.

If the thicknesses of the films 31 and 32 are kept within the limits given above, there will be in general only a slight change of the critical temperature of the combination of films 31 and 32 as compared to the critical temperature of the bulk metal S of which the film 31 is made.

Another limiting case is demonstrated in connection with FIG. 4, which shows a film 41 of thickness $t_{41}$ made of metal S, which in bulk form is superconducting at the temperature of operation. This film 41 is placed in intimate contact with a slab 42 of thickness $t_{42}$ made of a metal N, which metal in bulk form is normal conducting at the temperature of operation.

Reference is made to an article by A. B. Pippard, Proc. Roy. Soc., Vol. A 216, p. 547 seq. 1953, in which it is shown that superconducting electrons will drift from a superconducting phase into a normal conducting phase over a distance known as the range-of-order distance which is the order of 10,000 A.U. If the superconducting electrons drift from a superconducting metal into an adjoining normal conducting metal brought into uniform and continuous intimate contact with the superconducting metal, the range-of-order distance may have values different than the one value mentioned by Pippard.

In this particular situation, the thickness $t_{41}$ of film 41 is much smaller than the thickness $t_{42}$ of slab 42. In a typical case, $t_{41}<1000$ A. and $t_{42}>100{,}000$ A. Although a film 41 if separated from the slab 42 would be superconducting at the temperature of operation, the film 41 in intimate contact with the slab 42 is not superconducting even at the lowest temperatures for a certain range of thicknesses $t_{41}$ and $t_{42}$. This is produced by either one or both of the following mechanisms: (*a*) the drift rate of the superconducting electrons from the film 41 into the normal conducting slab 42 is larger than the rate at which superconducting electrons can be created in the film 41; and (*b*) the intimate contact with the normal material of the slab 42 actually changes the properties of the metal S of which the film 41 is made in a way that superconductivity is no longer favored.

There exists a range of thicknesses in between those in the two cases discussed above where not only the density of the superconducting electrons will be changed, but where also the transition temperature can be adjusted to a value different from that of the bulk metal S. It is thus possible to vary all of the important superconducting properties by a suitable choice of metals and thicknesses.

Another way of producing films with new superconducting properties is shown in FIG. 5. There exist metals $N_1$, the properties of which are not favorable for superconductivity at the desired temperature of operation because one of the properties has a value too large to permit superconductivity. If a metallic film 51 of such metal $N_1$ is brought into intimate contact with a metallic film 52 of metal $N_2$, said metal $N_2$ having too small a value favorable for superconductivity of the property which had too large a value in metal $N_1$, then the combination of the two films 51 and 52 will have superconducting properties. An example of such a combination is tin and indium, which singly are normal conducting at 4° K., but a suitable combination of which is at least partially superconducting at 4° K.

While in the construction mentioned above in connection with FIGS. 3 to 5, only unsupported thin films were shown, the broad application of this invention encompasses a great variety of designs. Quite generally speaking, wherever a previous design had a circuit element such as 1 of FIG. 1, or elements 11, 12, and 13 of FIG. 2, made of a single superconducting metal, the range of operations of such a device can be greatly enlarged by replacing the circuit element or elements by one made of a combination of metals according to the principles of this invention. It is of course impossible to give here the details of all possible arrangements. Only a few representative arrangements are shown in FIGS. 6 to 9.

Figure 6:
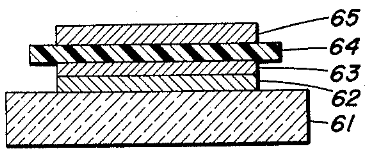
FIG. 6 is a cross section of a base plate supporting a plurality of metallic and insulating films.

FIG. 6 shows an insulating bottom plate 61 carrying a combination of two metallic films 62 and 63 placed in intimate contact, one of which is made from a metal, such as lead, which is superconducting at the temperature of operation, while the other is made from a metal, such as gold, which is normal conducting at the temperature of operation, with the dimensions of these two films 62 and 63 being chosen such that the superconducting properties of the combination of films 62 and 63 are different from those of the superconducting film 62 alone. This combination of films 62 and 63 is covered with an insulating layer 64, which, in turn, carries another superconducting film 65, such as niobium. For certain applications, the sequence of films 62, 63, and layer 64 may be repeated with slightly changed dimensions to give a differentiating network as described in connection with FIG. 2.

Figure 7:
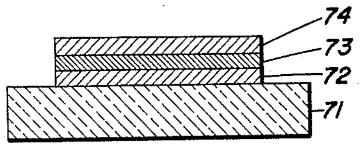
FIG. 7 is a cross section of base plate supporting a plurality of dissimilar metallic films.

FIG. 7 shows an insulating plate 71 with three films 72, 73, 74, placed in intimate contact thereon. Of these, the film 73 is made from superconducting metal, such as lead, while films 72 and 74 are made from normal conducting metals, such as gold, with the dimensions of the films being chosen such that the superconducting properties of the combination of films 72, 73, and 74 are different from those of film 73 alone.

Figure 8:
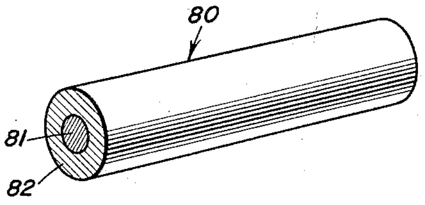
FIG. 8 is a perspective view of a thin wire consisting of a core and a shealth of dissimilar metals.

In FIG. 8, there is shown a thin wire 80 which consists of a core 81 made from a superconducting metal, such as lead, surrounded by sheath 82 made from a normal conducting metal, such as gold, with the dimensions thereof being chosen such that the combination of the core 81 and sheath 82 has different superconducting properties than the core 81 alone.

Figure 9:
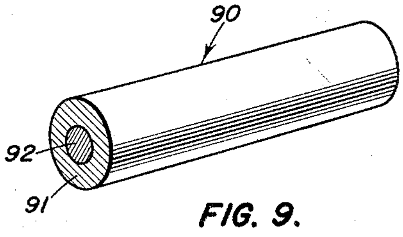
FIG. 9 is a perspective view of a thin wire consisting of a core and a sheath of dissimilar metals similar to FIG. 8.

FIG. 9 shows a thin wire 90 which consists of a core 92 made from a normal conducting metal, such as copper, surrounded by a sheath 91 made from a superconducting metal, such as lead. The dimensions of the core 92 and sheath 91 are chosen such that the superconducting properties of the combination of the core 92 and sheath 91 differ from those of the superconducting sheath 91 alone.

It is also to be noted that in FIGS. 8 and 9, a normal conducting metal can be substituted for the superconducting metals used for the parts 81 and 91, respectively as discussed in connection with FIG. 5, to obtain the effects discussed in FIG. 5.

Obviously many other modifications and variations of the invention are possible in the light of the above teachings. It is, therefore, to be understood that within the scope of the appended claims, the invention may be practiced otherwise than as specifically described.

What is claimed is:

1. In combination, a superconducting or partially superconducting circuit element having two metallic substructures in uniform and continuous intimate contact, one of said substructures being a normal conducting metal taken from the group consisting of chromium, constantan, copper, gold, platinum, silver and rhodium with the dimensions of the two metallic substructures and the metal of the other substructure being such that the combination of the two substructures requires a lower magnetic field for rendering the combination of substructures resistive than any one of the substructures alone; means for subjecting said circuit element to a magnetic field, and means for maintaining said circuit element at a temperature below the transition temperature of said combined substructures.

2. In combination, a superconducting or partially superconducting circuit element having at least two metallic films in uniform and continuous intimate contact, one of said films being of a superconducting metal taken from the group consisting of lead, indium, niobium, tantalum, tin and vanadium of a thickness less than the range-of-order distance, with the other of said films being such that the combination of the two films requires a lower magnetic field for rendering the combination of films resistive than those of the film made of the superconducting metal alone; means for subjecting said circuit element to a magnetic field, and means for maintaining said circuit element at a temperature below the transition temperature of said combined films.

3. In combination, a superconducting or partially superconducting circuit element having at least three metallic films in uniform and continuous intimate contact, with the center metallic film being of superconducting metal taken from the group consisting of lead, indium, niobium, tantalum, tin and vanadium positioned between two other metallic films of normal conducting metal and being of a thickness less than the range-of-order distance, with the dimensions of the metallic films being such that the combination of the three films requires a lower magnetic field for rendering the combination of films resistive than those of the film made of superconducting metal alone; means for subjecting said circuit element to a magnetic field, and means for maintaining said circuit element at a temperature below the transition of said combined metallic films.

4. In combination, a superconducting or partially superconducting circuit element having at least two films made from two different normal conducting metals taken from the group consisting of chromium, constantan, copper, gold, platinum, silver and rhodium in uniform and continuous intimate contact, the two metals and the thicknesses of the films being such that the combination of the two films exhibits at least partial superconductivity of the circuit element; means for subjecting said circuit element to a magnetic field, and means for maintaining said circuit element at a temperature below the transition temperature of said combined films.

5. In combination, a superconducting or partially superconducting circuit element in the form of a wire having a substructure in the shape of a core and a substructure in the form of a sheath surrounding said core, said core and sheath being in uniform and continuous intimate contact, one of said substructures being of a normal conducting metal taken from the group consisting of chromium, constantan, copper, gold, platinum, silver, and rhodium, with the dimensions of the two substructures and the metal of the other substructure being such that the combination of the two substructures requires a lower magnetic field for rendering the combination of substructures resistive than any of the substructures alone; means for subjecting said circuit element to a magnetic field, and means for maintaining said circuit element at a temperature below the transition temperature of said combined core and sheath.

6. In combination, a superconducting or partially superconducting circuit element in the form of a wire having a core and a sheath surrounding said core, said sheath being of a normal conducting metal taken from the group consisting of chromium, constantan, copper, gold, platinum, silver, and rhodium, with the dimensions of the core and the sheath being such that the combination requires a lower magnetic field for rendering the combination resistive than those of the core alone; means for subjecting said circuit element to a magnetic field, and means for maintaining said circuit element at a temperature below the transition temperature of said combined core and sheath.

7. In combination, a superconducting or partially superconducting circuit element in the form of a wire, a core formed of a normal conducting metal and a sheath surrounding said core and formed from a superconducting metal taken from the group consisting of lead, indium, niobium, tantalum, tin, and vanadium, of a thickness less than the range-of-order distance, with the dimensions of the core and sheath being such that the combination requires a lower magnetic field for rendering the combination resistive than that of the sheath alone; means for subjecting said circuit element to a magnetic field, and means for maintaining said circuit element at a temperature below the transition temperature of said combined core and sheath.

8. In combination, a superconducting or partially superconducting circuit element in the form of a wire having a core substructure, and a sheath substructure surrounding said core substructure, one of the substructures being of a superconducting metal taken from the group consisting of lead, indium, niobium, tantalum, tin, and vanadium of a thickness less than the range-of-order distance and the other substructure being of a normal conducting metal, with the dimensions thereof being such that the combination requires a lower magnetic field for rendering the combination resistive than those of the superconducting substructure; means for subjecting said circuit element to a magnetic field, and means for maintaining said circuit element at a temperature below the transition temperature of the combined core and sheath substructures.

9. In combination, a superconducting or partially superconducting circuit element in the form of a thin wire having a core made of a normal conducting metal, a sheath made of a normal conducting metal, said normal conducting metals for said core and sheath being taken from the group consisting of chromium, constantan, copper, gold, platinum, silver, and rhodium, said sheath surrounding and being in intimate contact with said core, with the dimensions of said core and sheath being chosen such that the combination exhibits at least partial superconductivity; means for subjecting said circuit element to a magnetic field, and means for maintaining said circuit element at a temperature below the transition temperature of the combined core and sheath substructures.

10. A superconducting or partially superconducting circuit element, comprising, two metallic substructures in uniform and continuous intimate contact, one of said substructures being a normal conducting metal taken from the group consisting of chromium, constantan, copper, gold, platinum, silver, and rhodium with the dimensions of the two metallic substructures and the metal of the other substructure being such that the combination of the two substructures require a lower magnetic field for rendering the combination of substructures resistive than any one of the substructures alone.

11. A superconducting or partially superconducting circuit element, comprising, at least two metallic films in uniform and continuous intimate contact, one of said films being of a superconducting metal taken from the group consisting of lead, indium, niobium, tantalum, tin, and vanadium of a thickness less than the range-of-order distance, with the other of said films being such that the combination of the two films requires a lower magnetic field for rendering the combination of films resistive than those of the film made of the superconducting metal alone.

12. A superconducting or partially superconducting circuit element, comprising, at least three metallic films in uniform and continuous intimate contact, with the center metallic film being of superconducting metal taken from the group consisting of lead, indium, niobium, tantalum, tin, and vanadium positioned between two other metallic films of normal conducting metal, with the dimensions of the metallic films being such that the combination of the three films requires a lower magnetic field for rendering the combination of films resistive than those of the film made of superconducting metal alone.

13. A superconducting or partially superconducting circuit element, comprising, at least two films of two different normal conducting metals in uniform and continuous intimate contact, said normal conducting metals being taken from the group consisting of chromium, constantan, copper, gold, platinum, silver and rhodium, the two metals and the thicknesses of the films being such that the combination of the two films exhibits at least partial superconductivity of circuit element.

14. A superconducting or partially superconducting circuit element in the form of a wire, comprising, a substructure in the shape of a core, a substructure in the form of a sheath surrounding said core, said core and sheath being in uniform and continuous intimate contact, one of said substructures being of a normal conducting metal, taken from the group consisting of chromium, constantan, copper, gold, platinum, silver and rhodium with the dimensions of the two substructures and the metal of the other substructure being such that the combination of the two substructures has different superconducting properties than any of the substructures alone.

References Cited in the file of this patent

UNITED STATES PATENTS

| | | |
|---|---|---|
| 199,601 | Wallace et al. | Jan. 22, 1878 |
| 1,405,534 | Merritt | Feb. 7, 1922 |
| 1,904,241 | Kammerer | Apr. 18, 1933 |
| 2,410,844 | Kerr et al. | Nov. 12, 1946 |
| 2,973,441 | Pratt | Feb. 28, 1961 |

FOREIGN PATENTS

| | | |
|---|---|---|
| 21,170 | Great Britain | 1901 |
| 217,784 | Australia | Oct. 22, 1958 |
| 415,272 | Germany | June 17, 1925 |
| 613,926 | Germany | May 28, 1935 |

OTHER REFERENCES

"Electronics," page 22, Oct. 20, 1957.